United States Patent
Yu et al.

(10) Patent No.: US 9,768,297 B2
(45) Date of Patent: Sep. 19, 2017

(54) PROCESS DESIGN TO IMPROVE TRANSISTOR VARIATIONS AND PERFORMANCE

(71) Applicant: Taiwan Semiconductor Manufacturing Co., Ltd., Hsin-Chu (TW)

(72) Inventors: Tsung-Hsing Yu, Taipei (TW); Chia-Wen Liu, Taipei (TW); Yeh Hsu, Guishan Township (TW); Shih-Syuan Huang, Taichung (TW); Ken-Ichi Goto, Hsin-Chu (TW); Zhiqiang Wu, Chubei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 14/935,760

(22) Filed: Nov. 9, 2015

(65) Prior Publication Data
US 2016/0064560 A1    Mar. 3, 2016

Related U.S. Application Data

(62) Division of application No. 14/156,515, filed on Jan. 16, 2014, now Pat. No. 9,224,814.

(51) Int. Cl.
*H01L 29/78* (2006.01)
*H01L 29/66* (2006.01)
(Continued)

(52) U.S. Cl.
CPC .... *H01L 29/7836* (2013.01); *H01L 21/02238* (2013.01); *H01L 21/02255* (2013.01);
(Continued)

(58) Field of Classification Search
None
See application file for complete search history.

(56) References Cited

U.S. PATENT DOCUMENTS

| 5,355,006 A | 10/1994 | Iguchi |
| 5,561,302 A | 10/1996 | Candelaria |

(Continued)

FOREIGN PATENT DOCUMENTS

| KR | 20100080159 A | 7/2010 |
| KR | 20130049540 A | 5/2013 |
| TW | 201349304 A | 12/2013 |

OTHER PUBLICATIONS

Non Final Office Action Dated Apr. 14, 2016 U.S. Appl. No. 14/880,469.

(Continued)

*Primary Examiner* — Andres Munoz
(74) *Attorney, Agent, or Firm* — Eschweiler & Potashnik, LLC

(57) ABSTRACT

The present disclosure relates to a transistor device having an epitaxial carbon layer and/or a carbon implantation region that provides for a low variation of voltage threshold, and an associated method of formation. In some embodiments, the transistor device has an epitaxial region arranged within a recess within a semiconductor substrate. The epitaxial region has a carbon doped silicon epitaxial layer and a silicon epitaxial layer disposed onto the carbon doped silicon epitaxial layer. A gate structure is arranged over the silicon epitaxial layer. The gate structure has a gate dielectric layer disposed onto the silicon epitaxial layer and a gate electrode layer disposed onto the gate dielectric layer. A source region and a drain region are arranged on opposing sides of a channel region disposed below the gate structure.

20 Claims, 8 Drawing Sheets

(51) Int. Cl.
  *H01L 21/306* (2006.01)
  *H01L 21/265* (2006.01)
  *H01L 21/02* (2006.01)
  *H01L 29/08* (2006.01)
  *H01L 29/16* (2006.01)
  *H01L 29/10* (2006.01)
  *H01L 29/161* (2006.01)

(52) U.S. Cl.
  CPC .. *H01L 21/02532* (2013.01); *H01L 21/02636* (2013.01); *H01L 21/26506* (2013.01); *H01L 21/30604* (2013.01); *H01L 29/0847* (2013.01); *H01L 29/1054* (2013.01); *H01L 29/1083* (2013.01); *H01L 29/16* (2013.01); *H01L 29/161* (2013.01); *H01L 29/6659* (2013.01); *H01L 29/66545* (2013.01); *H01L 29/7833* (2013.01); *H01L 21/26586* (2013.01)

(56) References Cited

U.S. PATENT DOCUMENTS

| | | | |
|---|---|---|---|
| 6,040,208 | A | 3/2000 | Honeycutt et al. |
| 6,215,148 | B1 | 4/2001 | Eitan |
| 6,541,343 | B1* | 4/2003 | Murthy ............ H01L 29/66636 257/E21.43 |
| 6,566,204 | B1 | 5/2003 | Wang et al. |
| 6,589,847 | B1 | 7/2003 | Kadosh et al. |
| 6,849,890 | B2 | 2/2005 | Kokubun |
| 7,276,407 | B2 | 10/2007 | Yamagata et al. |
| 7,507,999 | B2 | 3/2009 | Kusumoto et al. |
| 7,943,468 | B2 | 5/2011 | Curello et al. |
| 7,952,149 | B2 | 5/2011 | Dokumaci et al. |
| 8,034,679 | B1 | 10/2011 | Bulucea |
| 8,298,895 | B1 | 10/2012 | Alptekin |
| 8,557,659 | B2 | 10/2013 | Teo et al. |
| 8,569,156 | B1 | 10/2013 | Scudder et al. |
| 8,659,054 | B2* | 2/2014 | Rim ................ H01L 21/26506 257/192 |
| 8,669,615 | B1 | 3/2014 | Chang et al. |
| 9,224,814 | B2 | 12/2015 | Yu et al. |
| 9,419,136 | B2 | 8/2016 | Yu et al. |
| 2002/0033511 | A1 | 3/2002 | Babcock et al. |
| 2003/0008484 | A1 | 1/2003 | Hook |
| 2003/0075719 | A1 | 4/2003 | Sriram |
| 2005/0023535 | A1 | 2/2005 | Sriram |
| 2005/0173739 | A1 | 8/2005 | Kusumoto et al. |
| 2006/0220098 | A1 | 10/2006 | Lee et al. |
| 2006/0286729 | A1 | 12/2006 | Kavalieros |
| 2008/0195983 | A1 | 8/2008 | Chidambarrao et al. |
| 2008/0242032 | A1* | 10/2008 | Chakravarthi .... H01L 21/26513 438/285 |
| 2008/0272395 | A1 | 11/2008 | Banna |
| 2008/0272408 | A1 | 11/2008 | Vora |
| 2009/0289280 | A1 | 11/2009 | Zhang et al. |
| 2010/0317169 | A1 | 12/2010 | Sung et al. |
| 2010/0330763 | A1 | 12/2010 | Freeman et al. |
| 2011/0031503 | A1 | 2/2011 | Doris et al. |
| 2011/0079861 | A1 | 4/2011 | Shifren et al. |
| 2011/0215376 | A1 | 9/2011 | Holt et al. |
| 2013/0113041 | A1 | 5/2013 | Liu et al. |
| 2013/0200455 | A1 | 8/2013 | Lo et al. |
| 2014/0197411 | A1* | 7/2014 | Vakada ................. H01L 27/088 257/57 |
| 2015/0028426 | A1 | 1/2015 | Ching |
| 2015/0243759 | A1 | 8/2015 | Huang et al. |
| 2015/0263092 | A1 | 9/2015 | Hsiao et al. |
| 2015/0295085 | A1 | 10/2015 | Yu et al. |

OTHER PUBLICATIONS

Notice of Allowance Dated Mar. 28, 2016 U.S. Appl. No. 14/208,353.
Notice of Allowance Dated Jul. 14, 2016 U.S. Appl. No. 14/880,392.
Non Final Office Action Dated Nov. 27, 2015 U.S. Appl. No. 14/156,496.
Streetman, et al. "Solid State Electronic Devices." Fifth Edition. Published in 2000. pp. 311-315.
U.S. Appl. No. 14/156,496, filed Jan. 16, 2014. 27 Pages.
U.S. Appl. No. 14/156,505, filed Jan. 16, 2014. 23 Pages.
U.S. Appl. No. 14/156,546, filed Jan. 16, 2014. 29 Pages.
U.S. Appl. No. 14/208,353, filed Mar. 13, 2014.
Non Final Office Action Dated Feb. 23, 2015 U.S. Appl. No. 14/156,546.
Chih-Cheng Lu, et al.; "Strained Silicon Technology: Mobility Enhancement and Improved Short Channel Effect Performance by Stress Memorization Technique on nFET Devices"; Journal of the Electrochemical Society; Oct. 8, 2009, p. 1-4.
S. Flachowsky, et al.; "Stress Memorization Technique for n-MOSFETs: Where is the Stress Memorized?"; ULIS 2010—Ultimate Integration on Silicon; University of Glasgow; Mar. 2010; p. 1-4.
Nuo Xu; "Effectiveness of Strain Solutions for Next-Generation MOSFETs"; University of California—Berkley; Spring 2012; p. 1-103.
Shen, et al. "Molecular Dynamic Simulation Study of Stress Memorization in Si Dislocations." IEEE International Conference: Electron Devices Meeting (IEDM), 2012.
U.S. Appl. No. 13/288,201, filed Nov. 3, 2011.
U.S. Appl. No. 14/252,147, filed Apr. 14, 2014.
Notice of Allowance dated Jun. 26, 2015 for U.S. Appl. No. 14/156,546.
Notice of Allowance Dated Jul. 24, 2015 U.S. Appl. No. 14/252,147.
Non Final Office Action Dated Aug. 28, 2015 U.S. Appl. No. 14/208,353.
Notice of Allowance Dated Sep. 9, 2015 U.S. Appl. No. 14/156,505.
Notice of Allowance Dated Sep. 14, 2016 U.S. Appl. No. 14/880,469.
Non-Final Office Action dated Mar. 23, 2017 in connection with U.S. Appl. No. 15/172,417.
Non-Final Office Action dated May 19, 2017 in connection with U.S. Appl. No. 15/345,814.

* cited by examiner

PROCESS DESIGN TO IMPROVE TRANSISTOR VARIATIONS AND PERFORMANCE

REFERENCE TO RELATED APPLICATION

This Application is a Divisional of U.S. application Ser. No. 14/156,515 filed on Jan. 16, 2014, the contents of which are incorporated by reference in their entirety.

BACKGROUND

Modern day integrated circuits comprise millions or billions of transistors. Transistors may be used for amplifying or switching electronic signals and/or to provide functionality to integrated circuits. Transistors may be either n-type transistors (with n-type transistor channels) or p-type transistors (with p-type transistor channels). While transistors may be formed using various techniques and materials, they require accurate and precise placement of their various components and constituents to operate optimally and efficiently, especially as dimensions continue to shrink to meet advanced integration requirements. One such constituent is the dopant impurities that are introduced into the channel region because they directly influence the functionality and performance of the transistor device. The characteristics and location of the dopant impurities (i.e., the dopant profile) must be carefully controlled.

DETAILED DESCRIPTION

Figure 1:
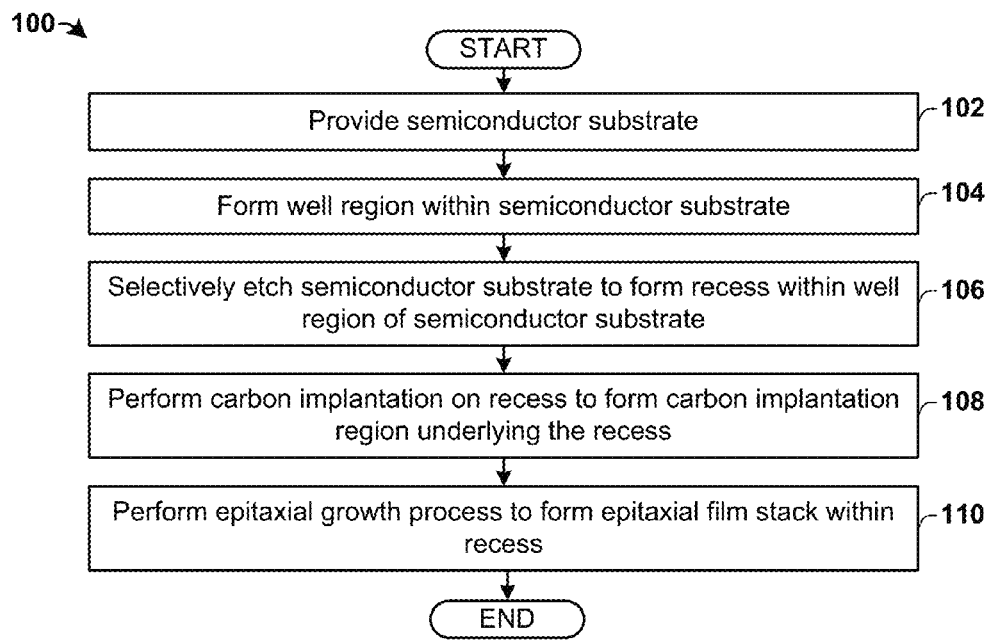
FIG. 1 illustrates a flow diagram of some embodiments of a method of forming a transistor device having a carbon implantation region configured to augment device performance by improving local and global drive current and threshold voltage variations.

The description herein is made with reference to the drawings, wherein like reference numerals are generally utilized to refer to like elements throughout, and wherein the various structures are not necessarily drawn to scale. In the following description, for purposes of explanation, numerous specific details are set forth in order to facilitate understanding. It may be evident, however, to one skilled in the art, that one or more aspects described herein may be practiced with a lesser degree of these specific details. In other instances, known structures and devices are shown in block diagram form to facilitate understanding.

Over the past few decades the semiconductor industry has made continual advances in manufacturing technology (e.g., photolithography), which have allowed for a steady reduction in transistor device size. Decreasing the size of a transistor device while keeping a power density constant improves the performance of the transistor. However, in recent years, as scaling has begun to reach the physical limitations of materials, scaling has begun to cause a number of problems with transistor devices.

For example, as transistor gate lengths continue to decrease, local and global variations of transistor threshold voltages have become worse. For example, during fabrication of an integrated chip, a plurality of separate processing operations are used to form structural features of transistor devices. Such processing operations may introduce dopant impurities into a transistor channel that may cause variations in the threshold voltages of transistor devices and therefore performance degradation. Such threshold voltage variations may be made worse when pocket implantation dose is increased to improve short-channel control of transistor devices.

Accordingly, the present disclosure relates to a method of forming a transistor device having a carbon implantation region configured to provide for low threshold voltage and low drive current variations, and an associated apparatus. The method comprises forming a well region within a semiconductor substrate. The semiconductor substrate is selectively etched to form a recess within the well region. After formation of the recess, a carbon implantation is selectively performed to form a carbon implantation region within the semiconductor substrate at a position underlying the recess. An epitaxial growth is then performed to form one or more epitaxial layers within the recess at a position overlying the carbon implantation region. Source and drain regions are subsequently formed within the semiconductor substrate such that a channel region, comprising the one or more epitaxial layers, separates the source/drains from one another. By forming the carbon implantation region at a position underlying the recess, the carbon implantation region can mitigate back diffusion of dopants from the semiconductor substrate to the epitaxial layers, resulting in a relatively low surface dopant concentration in the channel region that improves device performance by mitigating local and global threshold voltage and drive current variations.

FIG. 1 illustrates a flow diagram of some embodiments of a method 100 of forming a transistor device having a carbon implantation region configured to augment device performance by improving local and/or global threshold voltage and drive current variations between transistor devices.

At 102, a semiconductor substrate is provided. The semiconductor substrate may comprise an intrinsically doped semiconductor substrate having a first doping type (e.g., an n-type doping or a p-type doping).

At 104, a well region is formed within the semiconductor substrate. The well region may be formed by introducing dopants having a second doping type (e.g., a p-type doping or an n-type doping) into the semiconductor substrate.

At 106, the semiconductor substrate is selectively etched to form a recess within the well region of the semiconductor substrate.

At 108, a carbon implantation is selectively performed on the recessed semiconductor substrate to form a carbon implantation region within the semiconductor substrate at a position underlying the recess.

At 110, an epitaxial growth process is performed to form an epitaxial film stack within the recess. The epitaxial film stack comprises one or more epitaxial layers that are formed within the recess at a position overlying the carbon implantation region. In some embodiments, the epitaxial film stack may comprise silicon. In some embodiments, the epitaxial film stack may comprise a carbon doped epitaxial layer and an un-doped epitaxial layer. The carbon doped epitaxial layer may be epitaxially grown onto a bottom surface of the recess at a position overlying the silicon carbon implantation region. The un-doped epitaxial layer may be epitaxially grown onto the carbon doped epitaxial layer.

By performing the carbon implantation after formation of the recess and before the epitaxial growth process, the dose of the carbon implantation can be selected to form a carbon implantation region that mitigates back diffusion of dopants (e.g., n-type and/or p-type) from the well region of the semiconductor substrate to the one or more epitaxial layers. By mitigating back diffusion of dopants, a steep retrograde doping profile is generated within a channel region of the transistor device, which results in a relatively low surface dopant concentration (e.g., less than 1e18 cm$^{-3}$). The low surface dopant concentration, in turn is used to improve threshold voltage and drive current variations between transistor devices since random dopant fluctuations are proportional to the number of dopants in the channel region. For example, by retarding back diffusion of the deeper and heavy dopants from the well region using carbon implanting and the overlying epitaxy layer, short channel control is maintained and a size of depletion regions is reduced.

Figures 2A, 2B:
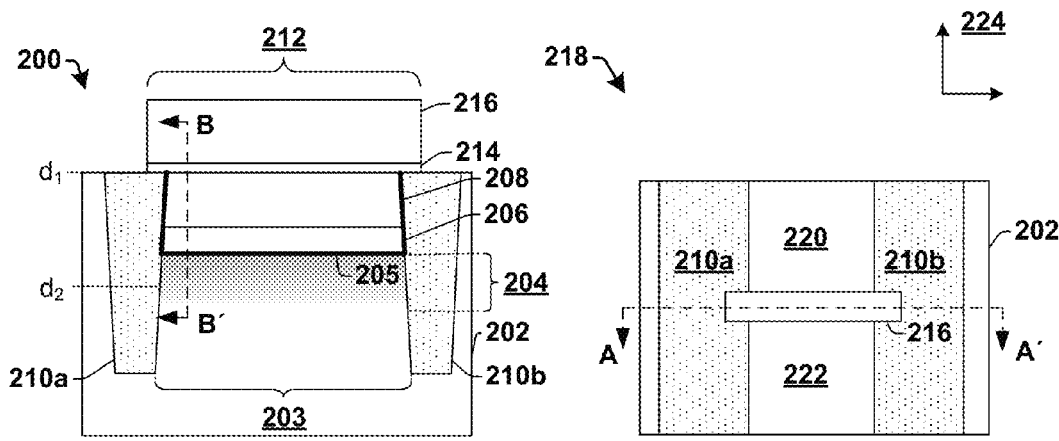
FIGS. 2A-2B illustrate some embodiments of a transistor device having a carbon implantation region configured to augment device performance.

FIGS. 2A-2B illustrate some embodiments of a transistor device 200 having a carbon implantation region 204 configured to augment device performance.

FIG. 2A illustrates a cross-sectional view (along line A-A' of FIG. 2B) of some embodiments of the disclosed transistor device 200. The transistor device 200 is formed within a semiconductor substrate 202 (e.g., a silicon substrate). A plurality of isolation structures 210a-210b may be disposed within the semiconductor substrate 202 at positions that separate the semiconductor substrate 202 into alternating isolation structures 210 and active regions 203. The isolation structures 210a-210b are configured to prevent current leakage between adjacent transistor devices. In some embodiments, the isolation structures 210a-210b comprise shallow trench isolation (STI) structures having a dielectric material disposed within a trench in the semiconductor substrate 202.

A recess 205 is located within a top surface of the semiconductor substrate 202 at a position between the isolation structures 210a-210b. A carbon implantation region 204 is disposed within the semiconductor substrate 202 at a position vertically underlying the recess 205 and laterally between isolation structures 210a and 210b. The carbon implantation region 204 comprises a carbon dopant. In some embodiments, the carbon implantation region 204 may comprise a carbon doping concentration having a Gaussian profile (in a direction of depth).

An epitaxial film stack is disposed within the recess 205. In some embodiments, the epitaxial film stack comprises a carbon doped epitaxial layer 206 disposed within the recess 205 at a position overlying the carbon implantation region 204. In some embodiments, the epitaxial film stack further comprises an lightly-doped epitaxial layer 208 (e.g., an epitaxial layer grown without doping, but having a low doping concentration due to back diffusion of dopants from the substrate 202) disposed within the recess 205 at a position overlying the carbon doped epitaxial layer 206. The carbon doped epitaxial layer 206 and the lightly-doped epitaxial layer 208 form a channel region of the transistor device 200, which is located (along direction 224) between a source region 220 and a drain region 222, as shown in top-view 218 of FIG. 2B. In some embodiments, the carbon doped epitaxial layer 206 and the lightly-doped epitaxial layer 208 may comprise silicon. In some embodiments, the channel region may comprise a first doping type (e.g., a p-type doping for an NMOS transistor). In such embodiments, the source region 220 and the drain region 222 may comprise a second doping type (e.g., an n-type doping).

The carbon implantation region 204 is configured to augment performance of the transistor device 200 (e.g., to improve local and global threshold voltage and drive current variations within the device) by mitigating dopant (e.g., n-type and/or p-type dopant) back diffusion from the semiconductor substrate 202 (e.g., from a well region within the semiconductor substrate) to generate a steep retrograde doping concentration profile along line B-B' of a channel region of transistor device 200. In some embodiments, the retrograde doping concentration profile may provide for a doping concentration that is less than 1e18 cm$^{-3}$ at a depth of $d_1$ (e.g., at an interface between the lightly-doped epitaxial layer 208 and a gate dielectric layer 214). The doping concentration profile has a large slope between a depth of $d_1$ and $d_2$, which indicates a rapid increase in doping concentration.

A gate structure 212 is disposed onto the semiconductor substrate 202 at a position overlying the lightly-doped epitaxial layer 208. In some embodiments, the gate structure 212 may comprise a stacked gate dielectric layer 214 and a gate electrode layer 216. The gate dielectric layer 214 (e.g., a silicon dioxide layer, a high-k dielectric layer, etc.) is disposed onto the lightly-doped epitaxial layer 208. The gate electrode layer 216 (e.g., a poly-silicon layer, a replacement metal gate layer, etc.) is disposed onto the gate dielectric layer 214.

Figure 3A:
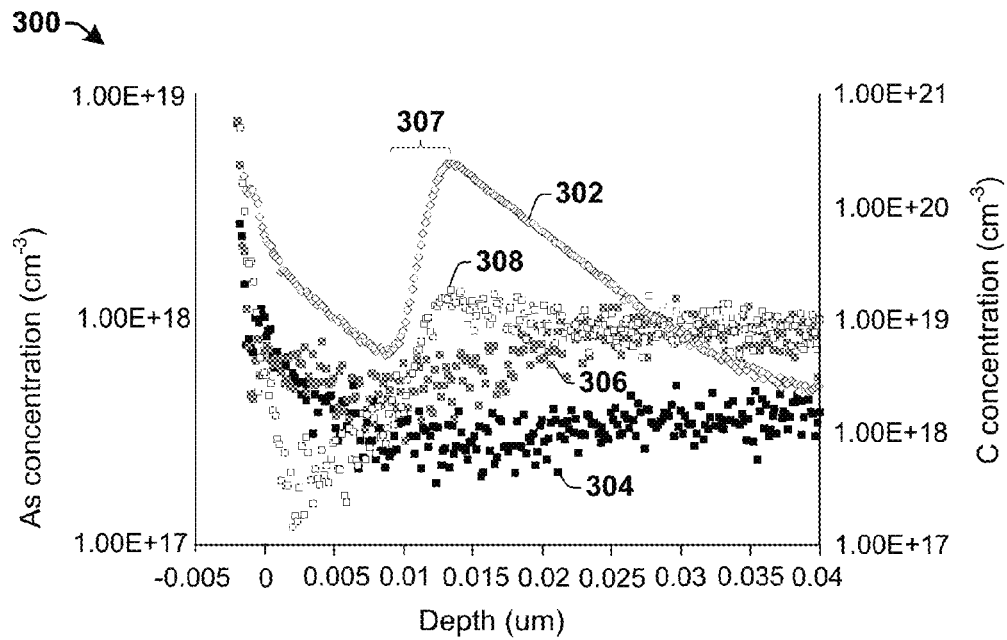
FIGS. 3A-3B illustrate graphs showing some embodiments of doping concentration profiles across a vertical cross-section of a channel region of a disclosed semiconductor device.
Figure 3B:
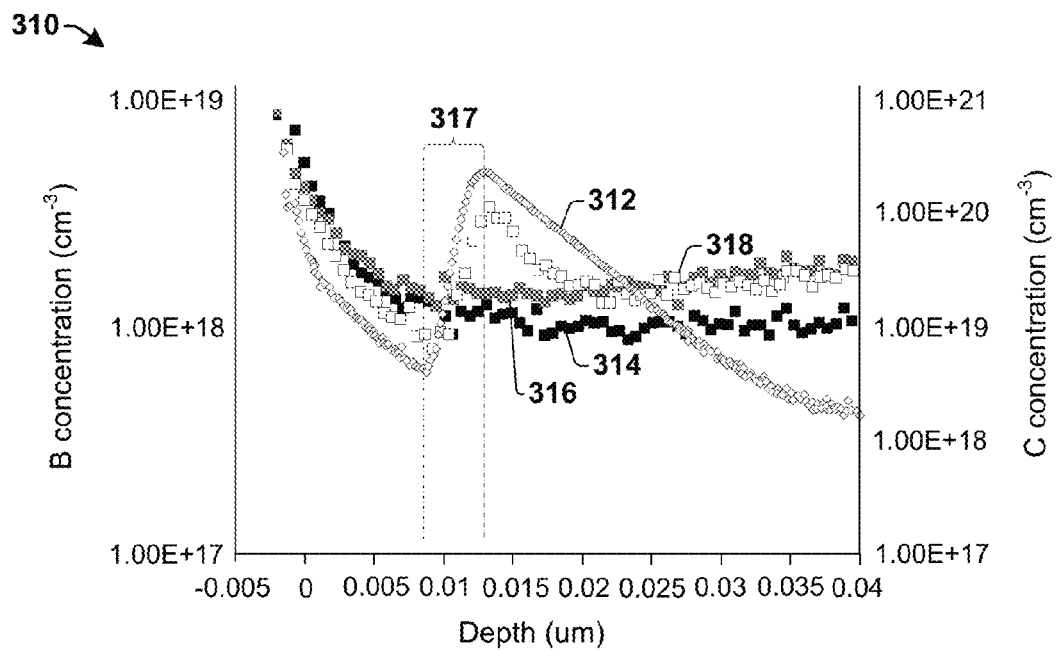

FIG. 3A-3B illustrates graphs, 300 and 310, showing some embodiments of experimental doping concentration profiles (y-axis) as a function of a depth into a semiconductor substrate (x-axis)(e.g., taken along line B-B' of FIG. 2A and starting from an interface between the lightly-doped epitaxial layer 208 and the gate dielectric layer 214).

Graph 300 illustrates a carbon doping concentration profile 302 along a section of a disclosed transistor device extending through a carbon implantation region (e.g., 204) and carbon doped epitaxial layer (e.g., 206) (on second y-axis) as a function of depth. The carbon doping concentration profile 302 has a peak dopant concentration, at a depth of between approximately 10 nm and approximately 15 nm.

Graph 300 also illustrates doping concentration profiles 304-308 of an arsenic doping as a function of depth. Doping concentration profile 304 corresponds to a transistor device having no epitaxial layers in the channel region. Doping concentration profile 306 corresponds to a transistor device having a channel region comprising epitaxial layers (e.g., carbon doped epitaxial layer 206 and lightly-doped epitaxial layer 208). Doping concentration profile 308 corresponds to a transistor device having a channel region comprising epitaxial layers and a carbon implantation region.

Doping concentration profile 308 shows a retrograde doping profile in a region 307 that corresponds to a location having a depth less than (i.e., physically over) the carbon doping concentration peak. The retrograde doping profile of doping concentration profile 308 has a steeper slope in region 307 than doping concentration profiles 304 and 306. The steep slope indicates that the carbon implantation region prevents back diffusion of arsenic into the epitaxial layers (e.g., to a depth of less than 10 nm). Due to the steep slope in region 307, doping concentration profile 308 has a lower doping concentration than doping concentration profiles 304 and/or 308 at a surface of a channel region (depth of 0 nm;

note that area of graph 300 in negative region is an overlying dielectric material), thereby mitigating local and global voltage threshold variations.

Graph 310 illustrates doping concentration profiles 314-318 of a boron doping as a function of depth. Doping concentration profile 314 corresponds to a transistor device having no epitaxial layers in the channel region. Doping concentration profile 316 corresponds to a transistor device having a channel region comprising epitaxial layers (e.g., carbon doped epitaxial layer 206 and lightly-doped epitaxial layer 208). Doping concentration profile 318 corresponds to a transistor device having a channel region comprising epitaxial layers and a carbon implantation region.

Doping concentration profile 318 shows a retrograde doping profile in a region 317 that corresponds to a location having a depth less than (i.e., physically over) the carbon doping concentration peak region. The retrograde doping profile of doping concentration profile 318 has a steeper slope in region 317 than doping concentration profiles 314 and 316, indicating that the carbon implantation region prevents back diffusion of boron into the epitaxial layers. Due to the steep slope in region 317, doping concentration profile 318 has a lower doping concentration than doping concentration profiles 316 and 314 at a surface of a channel region (depth of 0 nm), thereby mitigating local and global voltage threshold variations.

Figure 4:
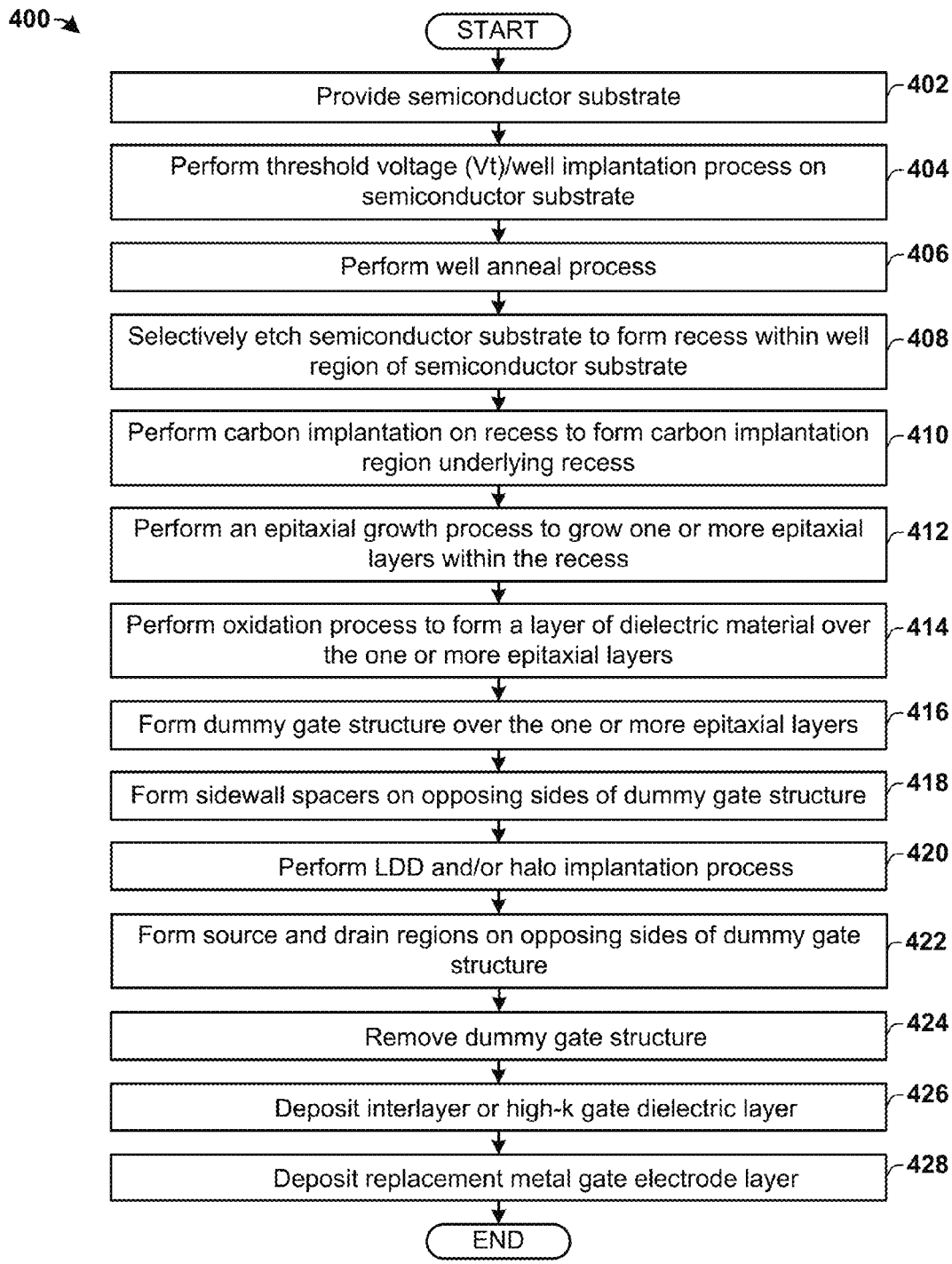
FIG. 4 illustrates a flow diagram of some additional embodiments of a method of forming a transistor device having a carbon implantation region configured to augment device performance.

FIG. 4 illustrates a flow diagram of some additional embodiments of a method 400 of forming a transistor device having a carbon implantation region configured to augment device performance by improving local and global threshold voltage and drive current variations.

While disclosed methods (e.g., methods 100 and 400) are illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 402, a semiconductor substrate is provided. In various embodiments, the semiconductor substrate may comprise any type of semiconductor body (e.g., silicon, silicon-germanium, silicon-on-insulator, etc.) such as a semiconductor wafer and/or one or more die on a semiconductor wafer, as well as any other type of semiconductor and/or epitaxial layers associated therewith.

At 404, a well/$V_t$ implantation process is performed to introduce dopants into the semiconductor substrate.

At 406, a well anneal process is performed on the semiconductor substrate to activate dopants introduced by the well/$V_t$ implantation process.

At 408, the semiconductor substrate is selectively etched to form a recess within the well region along a top surface of the semiconductor substrate.

At 410, a carbon implantation is performed on the recess to form a carbon implantation region at a position underlying the recess.

At 412, an epitaxial growth process is performed to grow one or more epitaxial layers within the recess. In some embodiments, the one or more epitaxial layers may comprise a carbon doped epitaxial layer and an overlying un-doped epitaxial layer having no dopants (i.e., having an intrinsic doping concentration of approximately $1e15$ $cm^{-3}$).

At 414, an oxidation process is performed. The oxidation process is performed at an elevated temperature to form a thin layer of dielectric material over the one or more epitaxial layers. In some embodiments, the oxidation process may be performed at an elevated temperature having a maximum temperature of less than or equal to 950° C. For example, the oxidation process may be performed at an elevated temperature having a range of between approximately 300° C. and approximately 950° C.

It will be appreciated that the elevated temperature of the oxidation process may enhance back diffusion of dopants from the well region into the overlying epitaxial layers. For example, the back diffusion may drive dopants into the un-doped epitaxial layer to form a lightly doped epitaxial layer. However, the carbon implantation region mitigates such back diffusion, resulting in a steep retrograde doping profile that provides for a relatively low surface dopant concentration (e.g., having a doping concentration of less than $1e18$ $cm^{-3}$) at a top surface of the one or more epitaxial layers.

At 416, a dummy gate structure is formed over the one or more epitaxial layers.

At 418, sidewall spacers may be formed on opposing sides of the dummy gate structure.

At 420, an LDD (lightly doped drain) and/or halo implantation process is performed. The LDD/halo implantation process introduces dopants into the semiconductor substrate.

At 422, a source region and a drain region are formed on opposing sides of the dummy gate structure. In some embodiments, the source and drain regions may be formed by performing a source/drain implantation. In other embodiments, the source and drain regions may be formed by forming doped epitaxial layers (e.g., silicon phosphide).

At 424, the dummy gate structure is removed. In various embodiments, the dummy gate structure may be removed by a wet etching process and/or a dry etching process.

At 426, an inter-layer gate dielectric layer or a high-k gate dielectric layer is deposited onto the one or more epitaxial layers.

At 428, a replacement metal gate electrode layer is deposited onto the inter-layer gate dielectric layer or the high-k gate dielectric layer.

FIGS. 5-15 illustrate some embodiments of cross-sectional views of a semiconductor substrate showing a method of forming a transistor device. Although FIGS. 5-15 are described in relation to method 400, it will be appreciated that the structures disclosed in FIGS. 5-15 are not limited to such a method.

Figure 5:
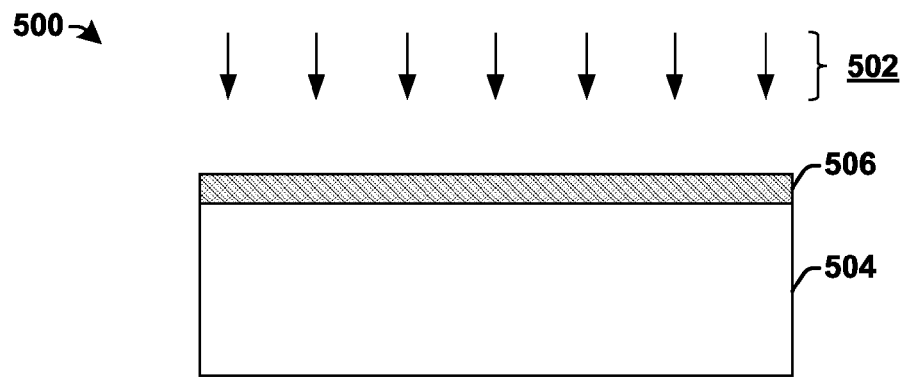
FIGS. 5-15 illustrate some embodiments of cross-sectional views of a semiconductor substrate showing a method of forming a transistor device having a carbon implantation region.

FIG. 5 illustrates a cross-sectional view 500 of some embodiments of a semiconductor substrate corresponding to acts 402-404.

As shown in cross-sectional view 500, a voltage threshold ($V_t$)/well implantation 502 is performed on the semiconductor substrate 504. The $V_t$/well implantation 502 is configured to introduce dopants 506 into the semiconductor substrate 504 to adjust the $V_t$ (threshold voltage) applied to a transistor to allow current to flow in a channel region. In some embodiments, the $V_t$/well implantation 502 may introduce a p-type dopant (e.g., boron) into the semiconductor substrate 504, while in other embodiments the $V_t$/well implantation 502 may introduce an n-type dopant (e.g., phosphorous, antimony, or arsenic) into the semiconductor substrate 504. In various embodiments, the $V_t$/well implantation 502 may use an implant energy of between approximately 5 keV (electron volts) and approximately 150 keV.

Figure 6:
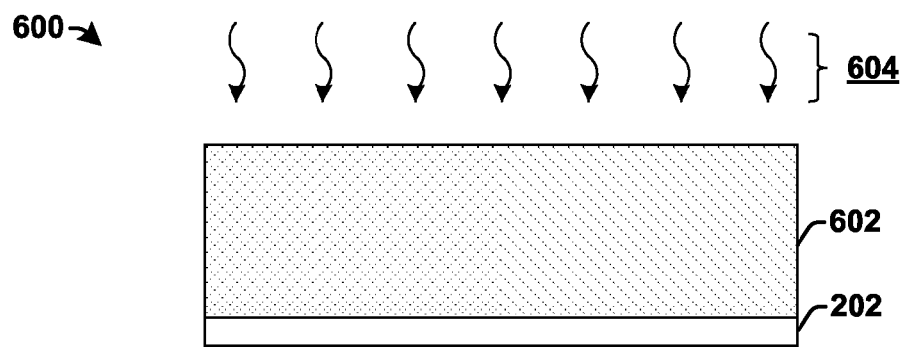

FIG. 6 illustrates a cross-sectional view 600 of some embodiments of a semiconductor substrate corresponding to act 406.

As shown in cross-sectional view 600, a well anneal process 604 is performed to activate the implanted dopants 506 introduce by the $V_t$/well implantation 502. The well anneal process 604 is performed by exposing the semiconductor substrate 504 to an elevated temperature (e.g., greater than or equal to 400° C.). The well anneal process 604 may also cure crystalline defects and/or cause diffusion and redistribution of dopant impurities to drive the implanted dopants 506 deeper into the semiconductor substrate 504 to from a well region 602.

Figure 7:
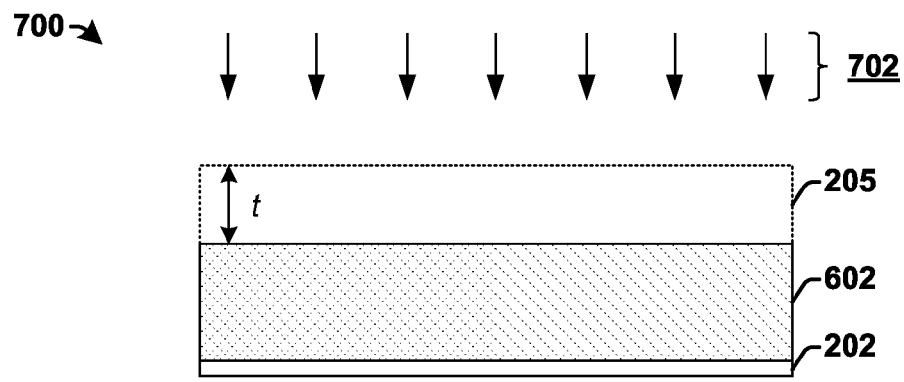

FIG. 7 illustrates a cross-sectional view 700 of some embodiments of a semiconductor substrate corresponding to act 408.

As shown in cross-sectional view 700, the semiconductor substrate 504 is exposed to an etchant 702 that is configured to selectively recess the semiconductor substrate (i.e., to reduce the thickness of a portion of the semiconductor substrate). Selectively recessing the semiconductor substrate forms a recess 205 within the semiconductor substrate 504. In some embodiments, the etchant 702 may be configured to remove a thickness t of a portion of the semiconductor substrate 504 that is between approximately 5 nm and approximately 30 nm, for example. In some embodiments, the etchant 702 may comprise a combination of a dry etchant (e.g., an ion bombardment) and a wet etchant (e.g., Tetramethylammonium hydroxide (TMAH), potassium hydroxide (KOH), etc.).

Figure 8:
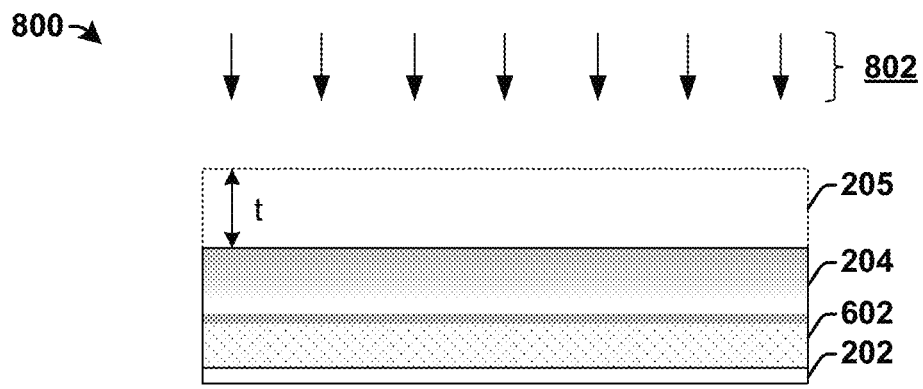

FIG. 8 illustrates a cross-sectional view 800 of some embodiments of a semiconductor substrate corresponding to act 410.

As shown in cross-sectional view 800, a carbon implantation 802 is performed on the recess to form a carbon implantation region 204 within the semiconductor substrate 202 at a position underlying the recess 205. The carbon implantation region 204 comprises a carbon doping (e.g., having a Gaussian doping profile). In some embodiments, the carbon implantation 802 may be configured to introduce carbon dopants into the recess 205 using an implantation energy of less than approximately 5 kiloelectron volts (keV).

Figure 9:
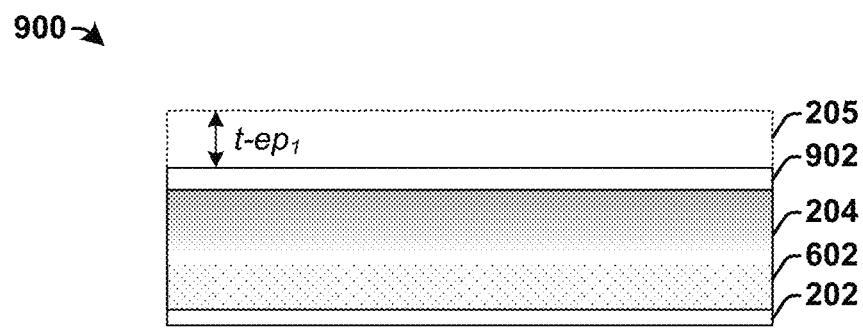
Figure 10:
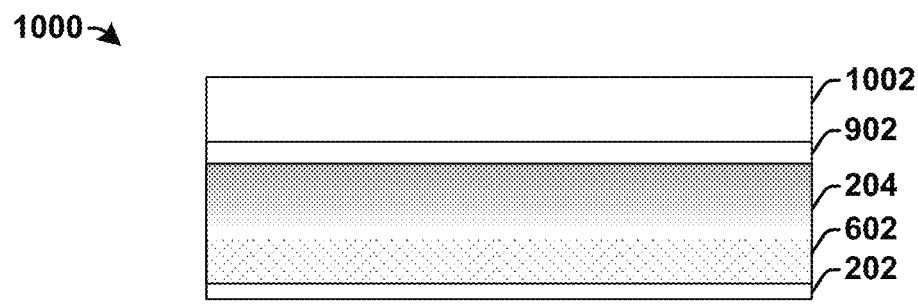

FIGS. 9-10 illustrate cross-sectional views, 900 and 1000, of some embodiments of a semiconductor substrate corresponding to act 412.

As shown in cross-sectional view 900, a silicon carbide (SiC) layer 902 is epitaxially grown within the recess 205 at a position overlying the carbon implantation region 204. In some embodiments, the SiC layer 902 may be epitaxially grown to a thickness $ep_1$ having a range of between approximately 2 nm and approximately 20 nm. The silicon carbide (SiC) layer 902 is un-doped.

As shown in cross-sectional view 1000, an un-doped silicon layer 1002 is epitaxially grown within the recess 205 at a position overlying the SiC layer 902. The un-doped silicon layer 1002 may be epitaxially grown to a thickness of between approximately 5 nm and approximately 30 nm.

Figure 11A:
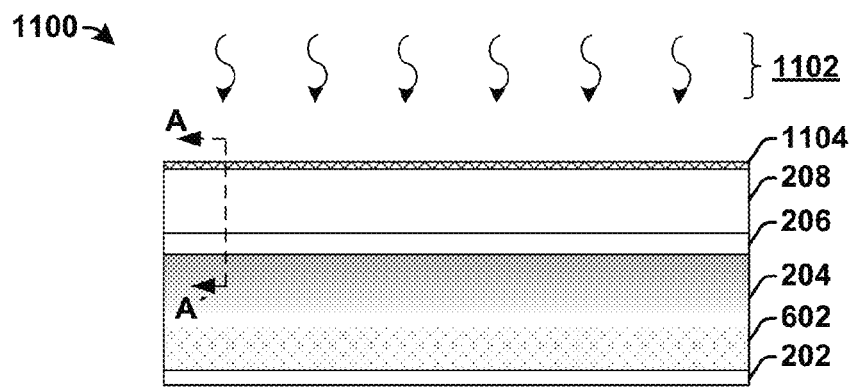
Figure 11B:
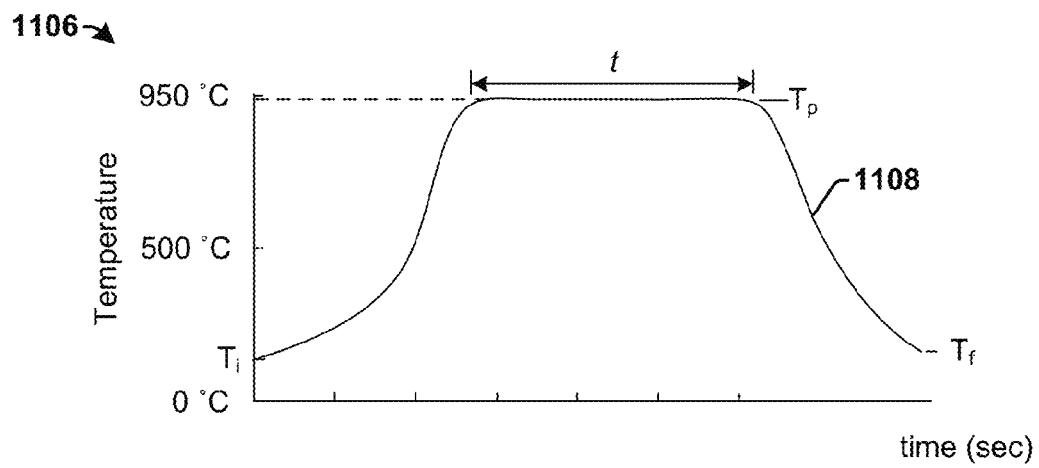
Figure 11C:
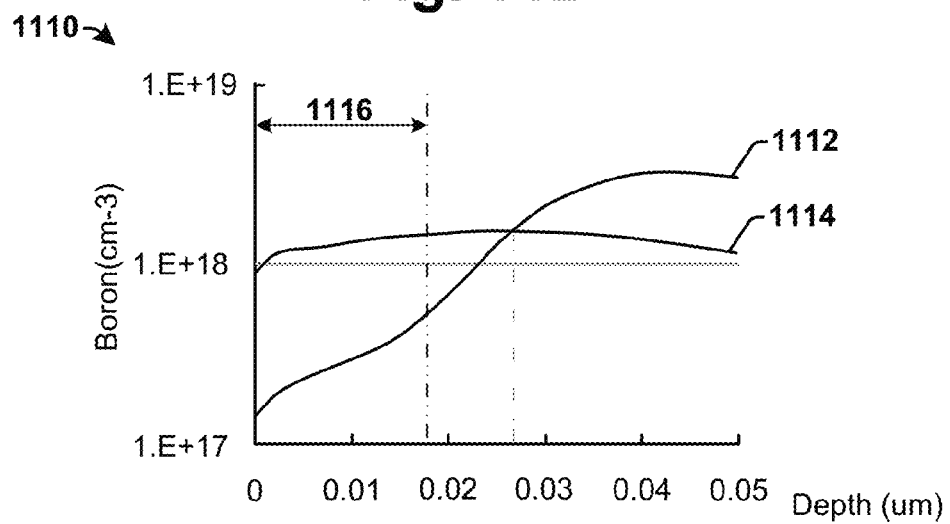

FIGS. 11A-11C illustrates some embodiments of an oxidation process corresponding to act 414.

FIG. 11A illustrates a cross-sectional view 1100 of some embodiments of a semiconductor substrate exposed to an oxidation process 1102 corresponding to act 414.

As shown in cross-sectional view 1100, an oxidation process 1102 is performed by exposing the un-doped silicon layer 1002 to an elevated temperature. The oxidation process 1102 results in a thin layer of dielectric material 1104 (e.g., oxide) being formed onto the un-doped silicon layer 1002.

In some embodiments, the elevated temperature may comprise a relatively low temperature having a maximum temperature of less than or equal to 950° C. For example, the elevated temperature may be between approximately 300° C. and approximately 950° C. In some embodiments, the oxidation process 1102 may expose the un-doped silicon layer 1002 to an elevated temperature for a time period of less than or equal to 60 seconds.

FIG. 11B illustrates a graph 1106 showing some embodiments of an exemplary temperature profile 1108 of the disclosed oxidation process 1102. The temperature profile 1108 begins from an initial temperature $T_i$ at time t=0, and increases to a peak temperature $T_p$ having a value of less than or equal to approximately 950° C. In various embodiments, the temperature profile 1108 may remain at a temperature value that is approximately equal to the peak temperature $T_p$ for a time t in a range of between 10 and 60 seconds. After time t has ended, the temperature profile 1108 decreases from the peak temperature $T_p$ to a final temperature $T_f$. In some embodiments, the initial temperature $T_i$ and the final temperature $T_f$ may be substantially the same.

The evaluated temperature of the oxidation process 1102 causes back diffusion of dopants from the well region 602 to the epitaxial layers, 902 and 1002, causing the un-doped epitaxial layer 1002 to turn into a lightly doped epitaxial layer (e.g., denoted as 208). However, by performing the oxidation process 1102 at a relatively low temperature of less than or equal to 950° C., the back diffusion of dopants from the well region 602 to the epitaxial layers, 902 and 1002, is reduced, thereby resulting in a lower doping concentration at the surface of the un-doped epitaxial layer 1002 (and therefore a lower variation of threshold voltage between transistor devices).

For example, FIG. 11C illustrates some embodiments of a graph 1110 showing a boron doping concentration profile (y-axis) as a function of a depth into a semiconductor substrate (x-axis)(e.g., taken along line A-A' of FIG. 11A and starting from a top of the un-doped epitaxial layer 1002) achieved by the disclosed 'low-temperature' oxidation process 1112 (performed at a low temperature of less than or equal to approximately 950° C.) and a 'high temperature' oxidation process 1114 (performed at a temperature of between approximately 1050° C. and 1100° C.).

As shown in graph 1110, the doping concentration profile achieved using the disclosed low-temperature oxidation process 1112 decreases sharply below a depth of less than approximately 30 nm to achieve a doping concentration of less than 1E18 cm-3 at the surface of the epitaxial layers (depth=0 um). In contrast, the doping concentration profile achieved using the high temperature oxidation process 1114 has a relatively constant slope that achieves a doping concentration of approximately 1E18 cm-3 at the surface of the epitaxial layers (depth=0 um). The difference between doping concentration profiles 1112 and 1114 also results in a doping concentration 1114 being larger than doping concentration 1112 below a depth of approximately 27 nm, such that the low temperature oxidation process provides for a lower doping concentration throughout an epitaxial channel region 1116 of a transistor device.

Figure 12:
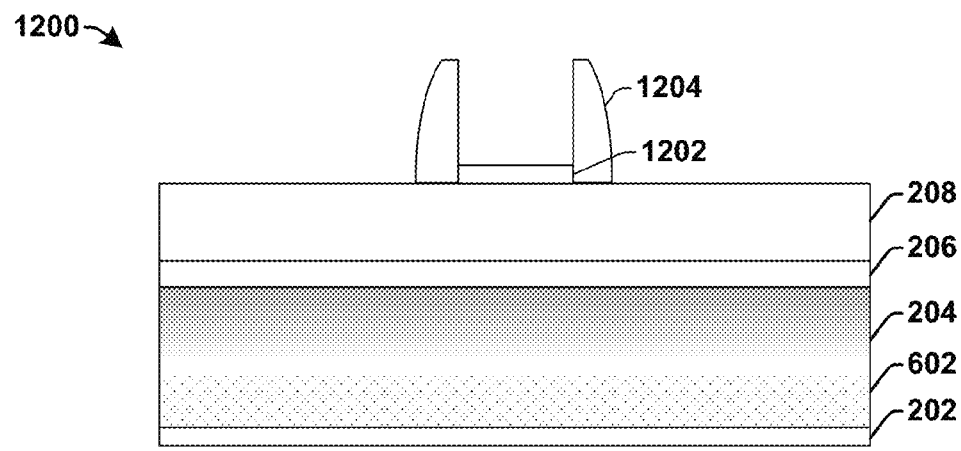

FIG. 12 illustrates a cross-sectional view 1200 of some embodiments of a semiconductor substrate corresponding to acts 416-418.

As shown in cross-sectional view 1200, a dummy gate structure 1202 is formed over the lightly-doped silicon 208. To form the dummy gate structure 1202 the layer of dielectric material 1104 is removed and a dummy gate structure 1202 is deposited onto the lightly-doped silicon layer 208. In some embodiments the dummy gate structure 1202 may comprise a polysilicon layer deposited onto the lightly-doped silicon layer 208 using a deposition technique (e.g., chemical vapor deposition, physical vapor deposition, etc.). Sidewall spacers 1204 may be formed on the outer sidewalls of the dummy gate structure 1202. In some embodiments, the sidewall spacers 1204 may be formed by depositing nitride onto the lightly-doped silicon layer 208 and selectively etching the nitride to form the sidewall spacers 1204.

Figure 13:
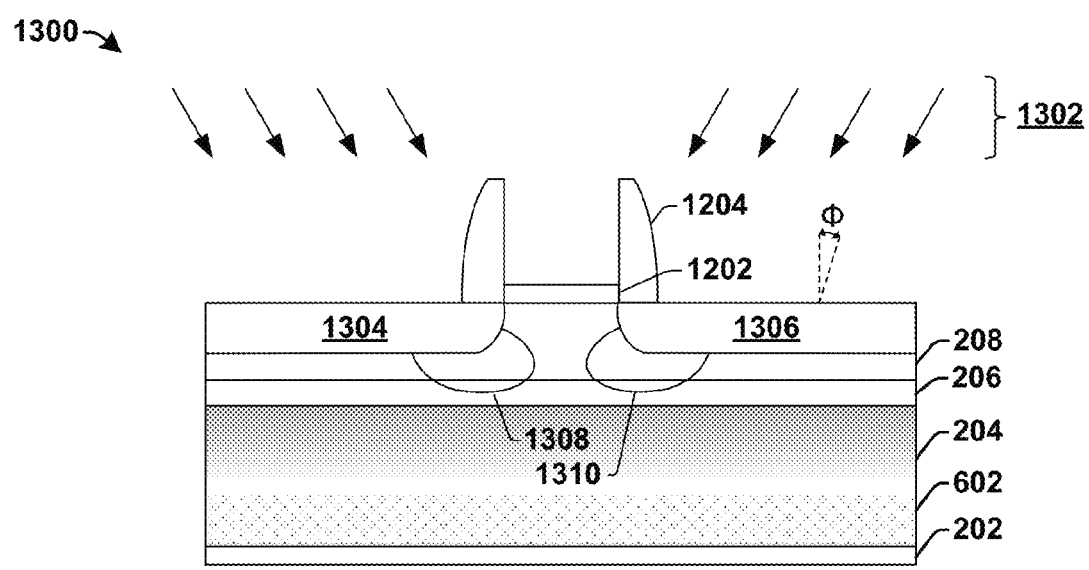

FIG. 13 illustrates a cross-sectional view 1300 of some embodiments of a semiconductor substrate corresponding to act 420.

As shown in cross-sectional view 1300, an LDD and/or halo implantation 1302 is performed. The LDD and/or halo implantation 1302 introduces dopants through an upper surface of the lightly-doped silicon layer 208. The LDD implantation is configured to form LDD impurity regions, 1304 and 1306, having a doping type that is different than that of well/$V_t$ implantation. The halo implantation is configured to form halo implantation regions, 1308 and 1310, having an opposite doping type as the LDD implantation into the periphery, but not the central portion, of a channel region. In some embodiments, the halo implantation 1302 may be performed at a tilt angle $\phi$ with respect to a top surface of the lightly-doped silicon layer 208. In some embodiments, the tilt angle $\phi$ may be 20 or less. Although cross-sectional view 1300 illustrates the halo implantation as being performed prior to the formation of source and drain regions (e.g., regions 1404 and 1406 in FIG. 14), it will be appreciated that in alternative embodiments the halo implantation may be performed after formation of the source and drain regions.

Figure 14:
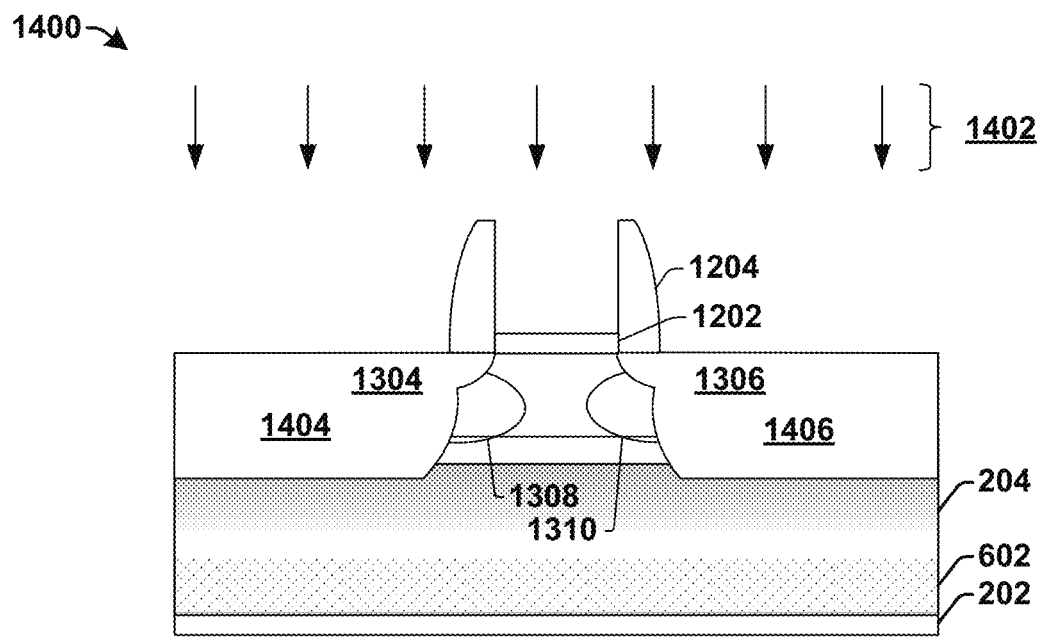

FIG. 14 illustrates a cross-sectional view 1400 of some embodiments of a semiconductor substrate corresponding to act 422.

As shown in cross-sectional view 1400, a source/drain implantation 1402 may be performed to form a source region 1404 and a drain region 1406. The source and drain regions, 1404 and 1406, are located on opposing sides of the dummy gate structure 1202 and may extend into the SiC layer 206 and the lightly-doped silicon layer 208. In some embodiments, the source and drain regions, 1404 and 1406, may be self-aligned to sidewall spacers 1204 surrounding dummy gate structure 1202. In alternative embodiments, the source and drain regions, 1404 and 1406, may be formed by growing one or more epitaxial layers (e.g. SiP) onto the substrate.

Figure 15:
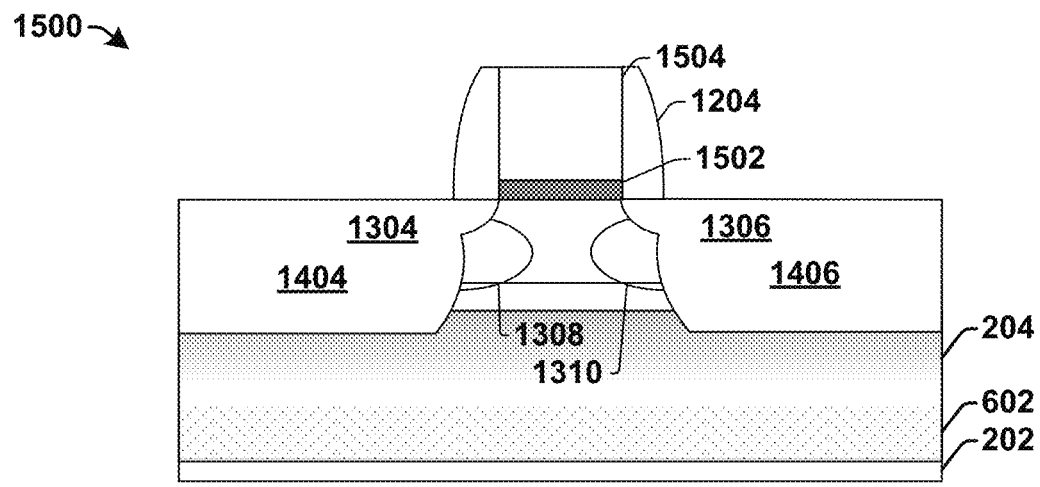

FIG. 15 illustrates a cross-sectional view 1500 of some embodiments of a semiconductor substrate corresponding to acts 424-428.

As shown in cross-sectional view 1500, the dummy gate structure is removed. An inter-layer gate dielectric layer or a high-k gate dielectric layer 1502 is deposited at a position replacing the dummy gate structure (i.e., between sidewall spacers 1204) using a deposition technique (e.g., chemical vapor deposition, physical vapor deposition, etc.). A replacement metal gate electrode layer 1504 is deposited over gate dielectric layer 1502 using a deposition technique. In some embodiments, the replacement metal gate electrode layer 1504 may comprise aluminum, for example.

It will be appreciated that while reference is made throughout this document to exemplary structures in discussing aspects of methodologies described herein, that those methodologies are not to be limited by the corresponding structures presented. Rather, the methodologies (and structures) are to be considered independent of one another and able to stand alone and be practiced without regard to any of the particular aspects depicted in the FIGS. Additionally, layers described herein, can be formed in any suitable manner, such as with spin on, sputtering, growth and/or deposition techniques, etc.

Also, equivalent alterations and/or modifications may occur to those skilled in the art based upon a reading and/or understanding of the specification and annexed drawings. The disclosure herein includes all such modifications and alterations and is generally not intended to be limited thereby. For example, although the figures provided herein, are illustrated and described to have a particular doping type, it will be appreciated that alternative doping types may be utilized as will be appreciated by one of ordinary skill in the art.

In addition, while a particular feature or aspect may have been disclosed with respect to only one of several implementations, such feature or aspect may be combined with one or more other features and/or aspects of other implementations as may be desired. Furthermore, to the extent that the terms "includes", "having", "has", "with", and/or variants thereof are used herein, such terms are intended to be inclusive in meaning—like "comprising." Also, "exemplary" is merely meant to mean an example, rather than the best. It is also to be appreciated that features, layers and/or elements depicted herein are illustrated with particular dimensions and/or orientations relative to one another for purposes of simplicity and ease of understanding, and that the actual dimensions and/or orientations may differ substantially from that illustrated herein.

The present disclosure relates a transistor device having an epitaxial carbon layer and/or a carbon implantation region configured to provide for a low variation of voltage threshold, and an associated method of formation.

In some embodiments, the present disclosure relates to a transistor device. The transistor device comprises an epitaxial region arranged within a recess within a semiconductor substrate. The epitaxial region comprises a carbon doped silicon epitaxial layer and a silicon epitaxial layer disposed onto the carbon doped silicon epitaxial layer. The transistor device further comprises a gate structure arranged over the silicon epitaxial layer. The gate structure comprises a gate dielectric layer disposed onto the silicon epitaxial layer and a gate electrode layer disposed onto the gate dielectric layer. The transistor device further comprises a source region and a drain region arranged on opposing sides of a channel region disposed below the gate structure.

In other embodiments, the present disclosure relates to a transistor device. The transistor device comprises a source region and a drain region disposed on opposing sides of a recess arranged within a semiconductor substrate. The transistor device further comprises a carbon implantation region disposed within the semiconductor substrate at a position underlying the recess. The transistor device further comprises a carbon doped epitaxial layer disposed within the recess at a position overlying the carbon implantation region, and a lightly-doped epitaxial layer disposed within the recess at a position overlying the carbon doped epitaxial layer. The transistor device further comprises a gate structure disposed onto the lightly-doped epitaxial layer.

In yet other embodiments, the present disclosure relates to a transistor device. The transistor device an epitaxial region having one or more epitaxial layers arranged within a recess within a semiconductor substrate. The transistor device further comprises a gate structure arranged over the epitaxial region. The gate structure comprises a gate dielectric layer disposed onto the epitaxial region and a gate electrode layer disposed onto the gate dielectric layer. The transistor device further comprises a source region and a drain region arranged within the epitaxial region on opposing sides of the gate structure. The epitaxial region has a doping profile that monotonically decreases from a lower surface of the epitaxial region to a doping concentration of less than 1E18 cm$^{-3}$ at an upper surface of the epitaxial region.

What is claimed is:

1. A transistor device, comprising:
   an epitaxial region arranged within a recess within a semiconductor substrate, wherein the epitaxial region comprises a carbon doped silicon epitaxial layer and a silicon epitaxial layer disposed onto the carbon doped silicon epitaxial layer;
   a carbon implantation region arranged within the semiconductor substrate below the recess, wherein the epitaxial region has a bottom surface contacting the carbon implantation region along an upper surface of the semiconductor substrate;
   a gate structure arranged directly over the carbon implantation region and the silicon epitaxial layer, wherein the gate structure comprises a gate dielectric layer disposed onto the silicon epitaxial layer and a gate electrode layer disposed onto the gate dielectric layer; and
   a source region and a drain region arranged on opposing sides of a channel region disposed below the gate structure.

2. The transistor device of claim 1, wherein the carbon implantation region extends under the gate structure from a first position below the source region to a second position below the drain region.

3. The transistor device of claim 1, wherein the carbon doped silicon epitaxial layer and the silicon epitaxial layer continuously extend below the gate structure.

4. The transistor device of claim 1, wherein the silicon epitaxial layer is laterally arranged between the source region and the drain region.

5. The transistor device of claim 1, wherein the source region and the drain region laterally contact the silicon epitaxial layer.

6. The transistor device of claim 1, wherein a doping profile within the epitaxial region has a doping concentration that is less than 1E18 cm$^{-3}$ at an interface between the silicon epitaxial layer and the gate structure.

7. The transistor device of claim 1, wherein the silicon epitaxial layer has an upper surface that is below the gate structure.

8. The transistor device of claim 1, wherein a doping profile within the epitaxial region has a peak concentration at a depth of between approximately 10 nm and approximately 15 nm below an upper surface of the epitaxial region.

9. The transistor device of claim 1, wherein the transistor device comprises a carbon doping profile that decreases from an upper surface of the epitaxial region to a first depth within the epitaxial region, that increases from the first depth to a second depth within the semiconductor substrate, and that decreases below the second depth.

10. The transistor device of claim 1, further comprising:
    shallow trench isolation regions arranged within the semiconductor substrate, wherein opposite ends of the gate structure extend directly over the shallow trench isolation regions along a first direction and wherein the gate structure is arranged between the source region and the drain region along a second direction perpendicular to the first direction.

11. A transistor device, comprising:
    a source region and a drain region disposed on opposing sides of a recess arranged within a semiconductor substrate;
    a carbon implantation region disposed within the semiconductor substrate at a position underlying the recess;
    a carbon doped epitaxial layer disposed within the recess at a position overlying the carbon implantation region;
    a lightly-doped epitaxial layer disposed within the recess at a position overlying the carbon doped epitaxial layer;
    a gate structure disposed onto the lightly-doped epitaxial layer; and
    lightly doped drain (LDD) implantation regions arranged directly below the gate structure within the lightly-doped epitaxial layer, wherein the LDD implantation regions are vertically separated from the carbon doped epitaxial layer by the lightly-doped epitaxial layer.

12. The transistor device of claim 11, wherein the carbon doped epitaxial layer and the lightly-doped epitaxial layer comprise silicon.

13. The transistor device of claim 11, wherein the lightly-doped epitaxial layer has a doping concentration that is less than 1E18 cm$^{-3}$ at an interface between the lightly-doped epitaxial layer and the gate structure.

14. The transistor device of claim 11, wherein the carbon doped epitaxial layer and the lightly-doped epitaxial layer continuously extend below the gate structure.

15. The transistor device of claim 11, wherein the source region and the drain region are arranged within the lightly-doped epitaxial layer.

16. A transistor device, comprising:
    an epitaxial region having one or more epitaxial layers arranged within a recess within a semiconductor substrate;
    a gate structure arranged over the epitaxial region, wherein the gate structure comprises a gate dielectric layer disposed onto the epitaxial region and a gate electrode layer disposed onto the gate dielectric layer;
    a source region and a drain region arranged within the epitaxial region on opposing sides of the gate structure; and
    wherein the epitaxial region has a doping profile that monotonically decreases from a lower surface of the epitaxial region to a doping concentration of less than 1E18 cm$^{-3}$ at an upper surface of the epitaxial region.

17. The transistor device of claim 16, further comprising:
    a carbon implantation region arranged within the semiconductor substrate at a position underlying the recess, wherein the epitaxial region has a bottom surface contacting the carbon implantation region along an upper surface of the semiconductor substrate.

18. The transistor device of claim 17, wherein the carbon implantation region extends below lower surfaces of the source region and the drain region.

19. The transistor device of claim 16, wherein the one or more epitaxial layers comprise:
    a carbon doped silicon epitaxial layer arranged along a lower surface of the recess; and
    a lightly doped silicon epitaxial layer arranged within the recess at a position overlying the carbon doped silicon epitaxial layer.

20. The transistor device of claim 19, wherein the carbon doped silicon epitaxial layer and the lightly doped silicon epitaxial layer continuously extend below the gate structure.

* * * * *